United States Patent
Minota et al.

(10) Patent No.: US 7,660,129 B2
(45) Date of Patent: Feb. 9, 2010

(54) PRINTED CIRCUIT BOARD, SOLDER CONNECTION STRUCTURE AND METHOD BETWEEN PRINTED CIRCUIT BOARD AND FLEXIBLE PRINTED CIRCUIT BOARD

(76) Inventors: Yuuji Minota, c/o NEC Corporation, 7-1, Shiba 5-chome, Minato-ku, Tokyo (JP); Yasuhiro Fukutomi, c/o NEC Corporation, 7-1, Shiba 5-chome, Minato-ku, Tokyo (JP); Motonobu Koike, c/o NEC Yamanashi, Ltd., 747, Magi, Otsukimachi, Otsuki-shi, Yamanashi 401-0016 (JP)

( * ) Notice: Subject to any disclaimer, the term of this patent is extended or adjusted under 35 U.S.C. 154(b) by 0 days.

(21) Appl. No.: 12/022,540

(22) Filed: Jan. 30, 2008

(65) Prior Publication Data

US 2008/0198566 A1 Aug. 21, 2008

(30) Foreign Application Priority Data

Feb. 19, 2007 (JP) ............................. 2007-038501

(51) Int. Cl.
*H05K 7/10* (2006.01)
(52) U.S. Cl. .................. 361/767; 361/771; 361/772; 174/255
(58) Field of Classification Search .............. 361/767, 361/771, 772; 174/255, 257, 261
See application file for complete search history.

(56) References Cited

U.S. PATENT DOCUMENTS 4,767,892 A * 8/1988 Kobari ........................ 174/256
5,090,120 A * 2/1992 Matsumoto ................... 29/846
H001471 H * 8/1995 Braun et al. ................ 361/704
5,640,047 A * 6/1997 Nakashima ................. 257/738
5,829,124 A * 11/1998 Kresge et al. ................. 29/840
6,861,346 B2 * 3/2005 Tong et al. .................. 438/613
6,890,186 B2 * 5/2005 Chien .......................... 439/68
7,033,917 B2 * 4/2006 Ho et al. .................... 438/584
7,098,407 B2 * 8/2006 Kim et al. ................... 174/257
7,208,341 B2 * 4/2007 Lee et al. .................... 438/106
7,230,339 B2 * 6/2007 Key et al. .................... 257/773
7,350,298 B2 * 4/2008 Hsu et al. ..................... 29/852
7,408,261 B2 * 8/2008 Yoon et al. .................. 257/737
7,417,197 B2 * 8/2008 Kent et al. .................. 174/261
2005/0286005 A1 * 12/2005 Watanabe et al. ........... 349/149
2006/0049238 A1 * 3/2006 Lim et al. .................... 228/215
2007/0035021 A1 * 2/2007 Suzuki et al. ............... 257/737

FOREIGN PATENT DOCUMENTS

| JP | 2001144401 A | 5/2001 |
| JP | 2004071992 A | 3/2004 |

* cited by examiner

*Primary Examiner*—Dean A. Reichard
*Assistant Examiner*—Xiaoliang Chen

(57) ABSTRACT

There is provided a printed circuit board in which a PCB and an FPC can be readily located, a solder connection structure and method between a printed circuit board and a flexible printed circuit board. The printed circuit board 1 includes a plurality of pads 2 for mounting a flexible printed circuit board, wherein a solder resist 3 is formed on the surface of the printed circuit board so as to expose the pads 2 and convex portions are formed by insulation print layers 4 around the pads 2.

10 Claims, 4 Drawing Sheets

(a)

(b)

(a)

(b)

PRINTED CIRCUIT BOARD, SOLDER CONNECTION STRUCTURE AND METHOD BETWEEN PRINTED CIRCUIT BOARD AND FLEXIBLE PRINTED CIRCUIT BOARD

This application is based upon and claims the benefit of priority from Japanese paten application No. 2007-038501, filed on Feb. 19, 2007, the disclosure of which is incorporated herein in its entirety by reference.

BACKGROUND OF THE INVENTION

The present invention relates to a printed circuit board, a solder connection structure and method between the printed circuit board and a flexible printed circuit board, and in particular, to a printed circuit board in which a PCB and an FPC can be readily located, a solder connection structure and method between a printed circuit board and a flexible printed circuit board.

DESCRIPTION OF THE RELATED ART

Most of apparatuses such as communication apparatuses have been further downsized and compacted in recent years. This tendency requires also built-in optical devices to be downsized and compacted, thereby a plurality of circuit boards needs to be housed inside.

To meet such a requirement, a structure is demanded which is low in cost and easy in handling at process of connecting circuit boards to each other.

Hitherto, any one of the following four structures has been used to connect a printed circuit board (PCB) to a flexible printed circuit board (FPC):

(1) a flex-rigid printed wiring board is used;
(2) a PCB is connected to an FPC through an FPC connector;
(3) circuit boards are connected to each other with a pin header; and
(4) a PCB is connected to an FPC by applying an anisotropic conductive film (ACF).

In the above first method, a flex-rigid printed wiring board is used in which a rigid wiring board and the FPC are integrated together. A flex-rigid printed wiring board is more expensive than a rigid wiring board or a FPC alone, leading to increase in production cost.

In the above second method, large space is needed to mount an FPC connector, which makes it difficult to meet a requirement for downsizing and compacting an apparatus.

In the above third method, a jig is needed for locating the PCB and the FPC to be combined with each other, so that it is not easy to combine them.

In the above fourth method, dedicated facilities are needed, which causes increasing the cost. Furthermore, a connection strength is uncertain.

Thus, the most practical method is to connect the PCB to the FPC by solder to realize downsizing and compactness of the apparatus and reduction of the cost, however, for that purpose, it is necessary to easily locate the PCB and the FPC at the time of connection by solder.

As a related art concerned with soldering on the PCB, there exist "Control Apparatus" disclosed in Patent Document 1 and "Printed Circuit Board" disclosed in Patent Document 2. The invention disclosed in Patent Document 1 aims at preventing flux from flowing out. The invention disclosed in Patent Document 2 aims at preventing a solder pad from being short-circuited by a solder bridge.

[Patent Document 1] Japanese Patent Laid Open Publication No. 2001-144401

[Patent Document 2] Japanese Patent Laid Open Publication No. 2004-71992

In addition to the above documents, there exists other proposals which attempt to solve problems with soldering on the PCB, however, it has not been realized that the PCB and the FPC can be easily located at the time of connection by solder.

The present invention has been made in view of the above problems. An exemplary object of the present invention is to provide a printed circuit board in which a PCB and an FPC can be readily located, a solder connection structure and method between a printed circuit board and a flexible printed circuit board.

SUMMARY OF THE INVENTION

To achieve the above object, the first aspect of the present invention provides a printed circuit board including a plurality of pads for mounting a flexible printed circuit board, wherein a first solder resist is formed on the surface of the printed circuit board so as to expose the pads and convex portions are formed around the pads.

In the first aspect of the present invention, the convex portion is preferably made of an insulation print layer formed by silk screen printing. In addition, the convex portion is preferably formed of a second solder resist. Furthermore, the second solder resist is deposited in several batches.

To achieve the above object, the second aspect of the present invention provides a connection structure between the printed circuit board and the flexible printed circuit board according to any one of configurations of the first aspect of the present invention, wherein the pads of the flexible printed circuit board which is spaced at a predetermined interval from the printed circuit board by touching the flexible printed circuit board to the convex portions are soldered to the pads of the printed circuit board with solder lying therebetween.

To achieve the above object, the third aspect of the present invention provides a method of connecting a printed circuit board to a flexible printed circuit board including the steps of: forming a solder resist such that a plurality of pads for mounting a flexible printed circuit board on a printed circuit board are exposed; forming insulation print layers by silk screen printing around the pads to form convex portions; touching the flexible printed circuit board to the convex portions to space the flexible printed circuit board at a predetermined interval from the printed circuit board; and soldering the pads of the flexible printed circuit board to the pads of the printed circuit board with solder lying therebetween.

To achieve the above object, the fourth aspect of the present invention provides a method of connecting a printed circuit board to a flexible printed circuit board including the steps of: forming a first solder resist such that a plurality of pads for mounting a flexible printed circuit board on a printed circuit board are exposed; forming second solder resists around the pads to form convex portions; touching the flexible printed circuit board to the convex portions to space the flexible printed circuit board at a predetermined interval from the printed circuit board; and soldering the pads of the flexible printed circuit board to the pads of the printed circuit board with solder lying therebetween.

In the fourth aspect of the present invention, the second solder resists are preferably deposited in several batches.

BRIEF DESCRIPTION OF THE DRAWINGS

The objects and features of the present invention will become more apparent from the consideration of the following detailed description taken in conjunction with the accompanying drawings, in which.

EXEMPLARY EMBODIMENT

First Exemplary Embodiment

Figure 1:
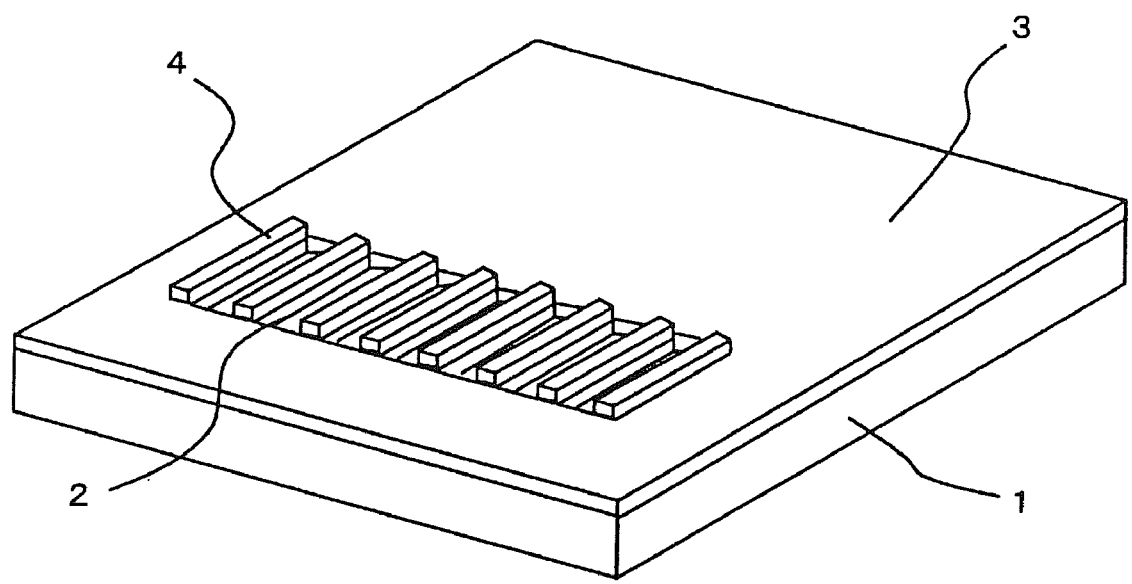
FIG. 1 is two views illustrating the configuration of a printed circuit board according to the first embodiment preferably carrying out the present invention.
Figure 1:
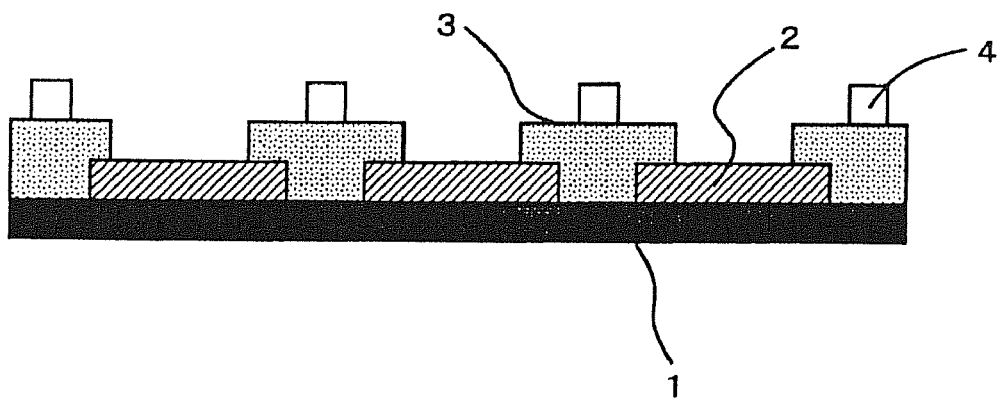

A first exemplary embodiment that preferably carries out the present invention is described below. FIG. 1 illustrates a configuration of a PCB according to the present embodiment. A plurality of pads 2 for connecting an FPC is formed on the PCB 1. Solder resists 3 are formed such that the pads 2 are exposed. Insulation print layers 4 are formed around the pads 2 by silk screen printing.

Figure 2:
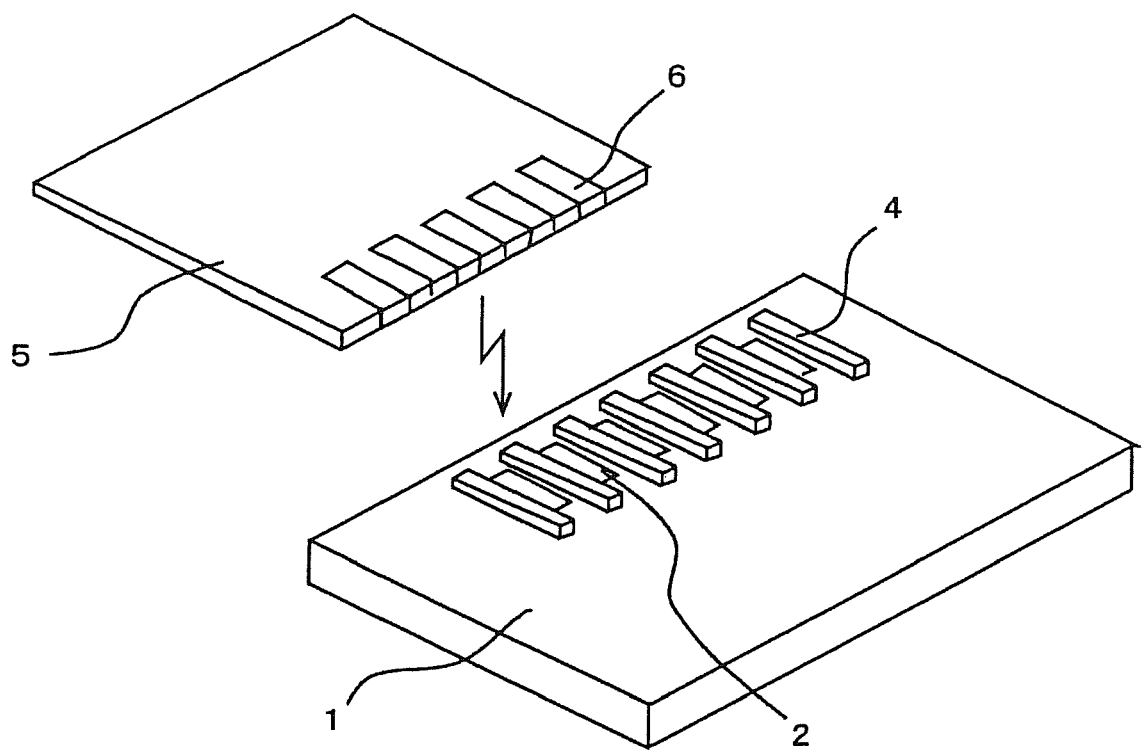
FIG. 2 is a view illustrating the configuration of connection between the PCB and the FPC and a cross section of the connection.
Figure 2:
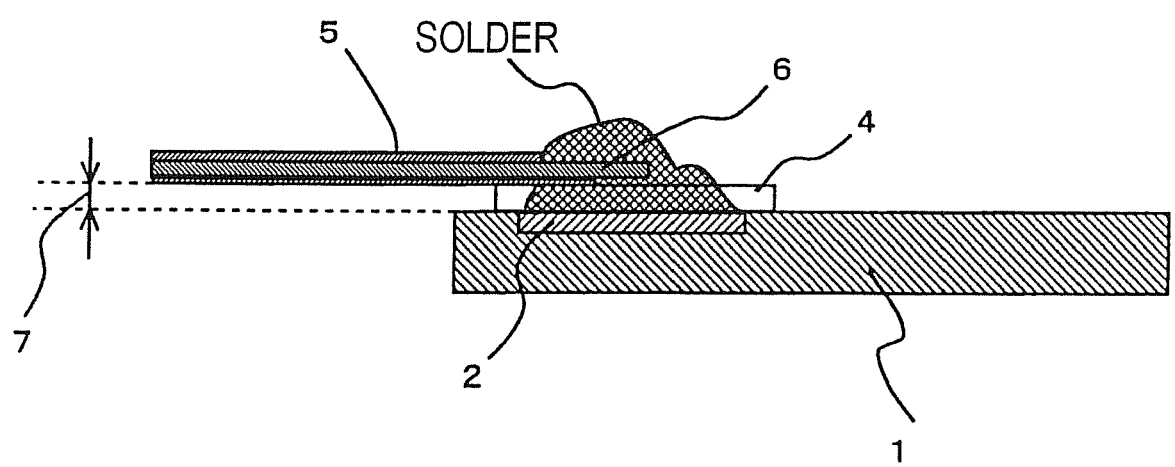
Figure 3:
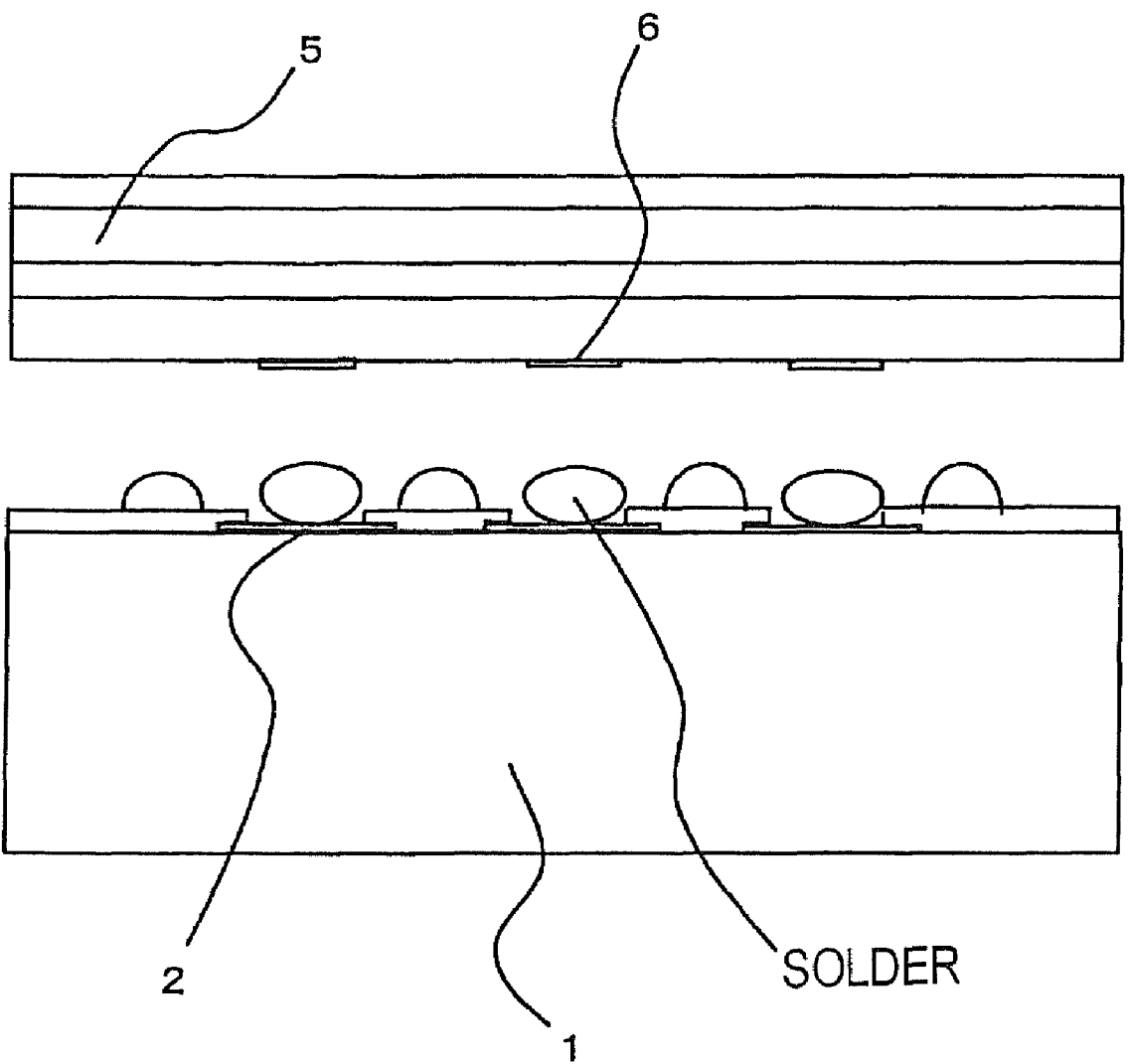
FIG. 3 is a view describing how the insulation print layer prevents the solder from flowing out.

The operation of connecting the FPC to the PCB is described below. FIG. 2 illustrates a configuration of connection between the PCB and the FPC.

An FPC pad 6 which is connected to the pad 2 of the PCB is provided on an FPC 5. Touching the pad 2 of the PCB to the pad 6 of the FPC forms a clearance 7 between the PCB and the FPC because the insulation print layer 4 is formed adjacently to the pad 2.

The pad 2 is electrically connected to the FPC pad 6 by manual soldering with the clearance 7 formed. Because the clearance 7 is ensured, molten solder easily flows between the PCB and the FPC to provide sufficient connection strength.

The insulation print layer 4 provided around the pad 2 separates other adjacent pads, which prevents molten solder from flowing into adjacent pads and a solder bridge or a solder ball from being formed at the time of connection, thereby a yield is improved.

Providing only the pad 2 used for solder connection as a connection section enables ensuring wide mounting space for other components.

The FPC and the PCB lower in price than a flex-rigid printed wiring board are used in the structure of the present embodiment, so that the structure can be formed at low cost. The clearance is ensured by the insulation print layer formed by silk screen printing, a jig is not necessary to adjust height at the time of soldering. Consequently, an assembling can be easily carried out.

In addition, the FPC can be folded after connection, which facilitates assembling into a housing.

Second Exemplary Embodiment

Figure 4:
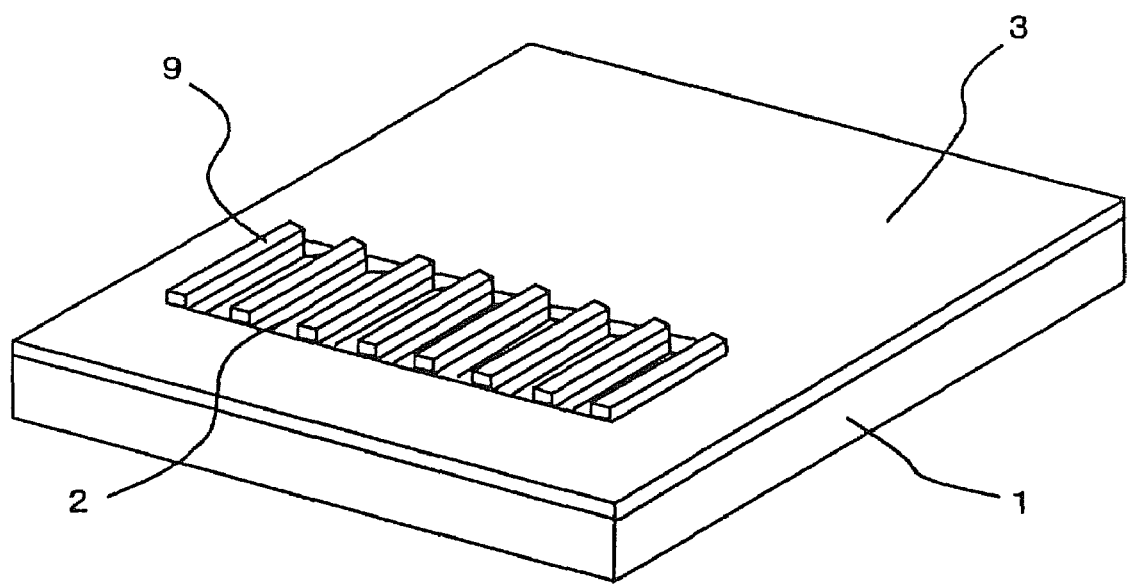
FIG. 4 is two views illustrating the configuration of a printed circuit board according to the second embodiment preferably carrying out the present invention.
Figure 4:
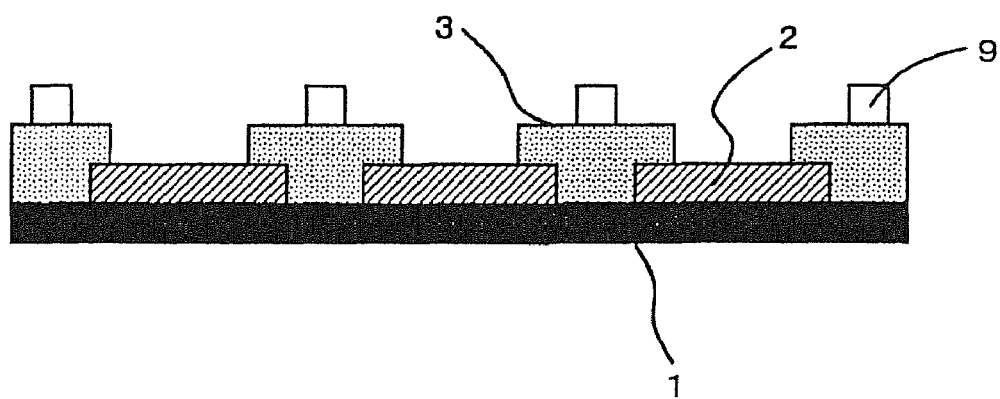

A second exemplary embodiment that preferably carries out the present invention is described below. FIG. 4 illustrates a configuration of a PCB according to the present embodiment. The PCB according to the present embodiment is substantially the same in configuration as the PCB according to the first embodiment, however, the present embodiment is different from the first embodiment in that a solder resist 9 is provided around the pad 2.

As is the case with the insulation print layer 4 in the first embodiment, the solder resist 9 forms a predetermined clearance between the PCB and the FPC. Therefore, the configuration of the present embodiment also provides the same effect as that of the first embodiment.

The process for connecting the PCB to the FPC is similar to that in the first embodiment, so that the duplicated description is omitted.

According to the present invention, there can be provided a printed circuit board in which a PCB and an FPC can be readily located, a solder connection structure and method between a printed circuit board and a flexible printed circuit board.

Incidentally, the above each embodiment is one example of preferable embodiments of the present invention, and the present invention is not limited to these embodiments.

For example, although the insulation print layer or the solder resist is disposed between the pads to form a clearance between the PCB and the FPC in the above each embodiment, the insulation print layer or the solder resist may be provided in the form of enclosing the pad.

Thus, the present invention enables various modifications.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A printed circuit board comprising:
    a plurality of pads for mounting a flexible printed circuit board;
    a first solder resist formed directly on a surface of the printed circuit board such that the pads are exposed, the first solder resist being non-concave; and,
    an element formed directly on the first solder resist such that the first solder resist separates the element from the surface of the printed circuit board, the element and the first solder resist together defining convex portions in relation to the pads in a z-direction perpendicular to the surface of the printed circuit board,
    wherein all points of a top surface of the first solder resist lie above top surfaces of the pads along the z-direction,
    and wherein the first solder resist and the element are part of the printed circuit board and are not part of the flexible printed circuit board.

2. The printed circuit board according to claim 1, wherein the element is a silk screen-printed insulation print layer.

3. The printed circuit board according to claim 1, wherein the element is a second solder resist.

4. The printed circuit board according to claim 3, wherein the second solder resist is batch-deposited.

5. A connection structure between the printed circuit board and the flexible printed circuit board according to claim 1, wherein
    the pads of the flexible printed circuit board are spaced at a predetermined interval from the printed circuit board, the flexible printed circuit board is soldered to the pads of the printed circuit board, and the flexible printed circuit board makes contact with the convex portions.

6. A printed circuit board comprising:

a substrate having a top surface and a plurality of holes, the holes extending from the top surface of the substrate but not completely through the substrate;

a plurality of pads for mounting a flexible printed circuit board, the pads corresponding to the holes of the substrate, each pad positioned within a corresponding hole such that a top surface of the pad is at least substantially completely flush with the top surface of the substrate surrounding the corresponding hole;

a first solder resist formed directly on a surface of the printed circuit board such that the pads are exposed;

an element formed directly on the first solder resist such that the first solder resist separates the element from the surface of the printed circuit board, the element and the first solder resist together defining convex portions in relation to the pads in a z-direction perpendicular to the surface of the printed circuit board; and wherein the first solder resist and the element are part of the printed circuit board and are not part of the flexible printed circuit board.

7. The printed circuit board according to claim 6, wherein the element is a silk screen-printed insulation print layer.

8. The printed circuit board according to claim 6, wherein the element is a second solder resist.

9. The printed circuit board according to claim 8, wherein the second solder resist is batch-deposited.

10. A connection structure between the printed circuit board and the flexible printed circuit board according to claim 6, wherein the pads of the flexible printed circuit board are spaced at a predetermined interval from the printed circuit board, the flexible printed circuit board is soldered to the pads of the printed circuit board, and the flexible printed circuit board makes contact with the convex portions.

* * * * *